United States Patent
Mazumder et al.

(10) Patent No.: US 11,171,094 B2
(45) Date of Patent: Nov. 9, 2021

(54) HERMETIC FULLY-FILLED METALLIZED THROUGH-HOLE VIAS

(71) Applicant: CORNING INCORPORATED, Corning, NY (US)

(72) Inventors: Prantik Mazumder, Ithaca, NY (US); Chukwudi Azubuike Okoro, Painted Post, NY (US); Ah-Young Park, Daejeon (KR); Scott Christopher Pollard, Big Flats, NY (US); Navaneetha Krishnan Subbaiyan, Portland, OR (US)

(73) Assignee: Corning Incorporated, Corning, NY (US)

( * ) Notice: Subject to any disclaimer, the term of this patent is extended or adjusted under 35 U.S.C. 154(b) by 83 days.

(21) Appl. No.: 16/744,776

(22) Filed: Jan. 16, 2020

(65) Prior Publication Data
US 2020/0251424 A1 Aug. 6, 2020

Related U.S. Application Data

(60) Provisional application No. 62/801,418, filed on Feb. 5, 2019.

(51) Int. Cl.
*H01L 23/495* (2006.01)
*H01L 23/00* (2006.01)
(Continued)

(52) U.S. Cl.
CPC .......... *H01L 23/562* (2013.01); *H01L 21/486* (2013.01); *H01L 23/15* (2013.01); *H01L 23/49827* (2013.01); *H01L 23/49838* (2013.01)

(58) Field of Classification Search
USPC ....................................................... 257/668
See application file for complete search history.

(56) References Cited

U.S. PATENT DOCUMENTS 9,656,909 B2    5/2017  Burket et al.
2014/0144681 A1*  5/2014 Pushparaj ............... C23C 28/34
                                                          174/257
(Continued)

FOREIGN PATENT DOCUMENTS

WO    2018/094162 A1    5/2018

OTHER PUBLICATIONS

Ryu et al.; "Impact of Near-Surface Thermal Stresses on Interfacial Reliability of Through-Silicon Vias for 3-D Interconnects"; IEEE Transactions on Device and Materials Reliability; vol. 11, No. 1 (2011) pp. 35-43.
(Continued)

*Primary Examiner* — Niki H Nguyen
(74) *Attorney, Agent, or Firm* — Amy T. Lang; John P. McGroarty

(57) ABSTRACT

According to various embodiments, an article including a glass or glass-ceramic substrate having a first major surface and a second major surface, and a via extending through the substrate from the first major surface to the second major surface over an axial length, L, the via defining a first axial portion, a third axial portion, and a second axial portion disposed between the first and third axial portions. The article further includes a helium hermetic adhesion layer disposed on the interior surface in the first and/or third axial portions and a metal connector disposed within the via, the metal connector being adhered to the helium hermetic adhesion layer. The metal connector fully fills the via over the axial length, L, the via has a maximum diameter, $\Phi_{max}$, of less than or equal to 30 µm, and the axial length, L, and the maximum diameter, $\Phi_{max}$, satisfy an equation:

$$\frac{L}{\sqrt{\Phi_{max}}} > 20 \text{ micron}^{1/2}.$$

20 Claims, 12 Drawing Sheets

(51) Int. Cl.
*H01L 23/15* (2006.01)
*H01L 21/48* (2006.01)
*H01L 23/498* (2006.01)

(56) References Cited

U.S. PATENT DOCUMENTS

2017/0287728 A1    10/2017  Dahlberg et al.
2018/0166354 A1     6/2018  Imayoshi
2018/0342451 A1*   11/2018  Dahlberg ........... B23K 26/0006
2019/0239353 A1     8/2019  Jayaraman
2019/0304877 A1    10/2019  Mobley et al.
2019/0313524 A1    10/2019  Huang et al.

OTHER PUBLICATIONS

International Search Report and Written Opinion of the International Searching Authority; PCT/US2020/014501; dated Apr. 3, 2020; 11 Pages; European Patent Office.
Lane et al.; "Adhesion and Reliability of Copper Interconnects With Ta and TaN Barrier Layers"; Journal of Materials Research; vol. 15, No. 1; (2000.

* cited by examiner

HERMETIC FULLY-FILLED METALLIZED THROUGH-HOLE VIAS

This application claims the benefit of priority to U.S. Provisional Application Ser. No. 62/801,418 filed on Feb. 5, 2019, the content of which is relied upon and incorporated herein by reference in its entirety.

FIELD

The present specification generally relates to vias in glass and glass ceramic substrates and, more particular, to hermetically sealed, fully-filled metallized vias in glass and glass ceramic substrates.

BACKGROUND

Glass and glass ceramic substrates with vias are desirable for many applications, including for use as in interposers used as electrical interfaces, RF filters, and RF switches. Glass substrates have become an attractive alternative to silicon and fiber reinforced polymers for such applications.

It is desirable to fill such vias with a conductor. Copper is presently the most desirable material for such conductors. However, copper does not adhere well to glass. In particular, a hermetic seal between copper and glass is desired for some applications. Such a seal is difficult to obtain because copper does not adhere well to glass, and because of a large mismatch in the coefficients of thermal expansion of many conductor materials, such as copper, and many desirable glass and glass ceramic substrate compositions. Additionally, when copper is adhered to the glass, the large mismatch in the coefficient of thermal expansions of the copper and the glass can result in the formation of radial and/or circumferential cracking of the glass when the glass article is subjected to high temperature processing. Radial cracks are formed during heating due to the free expansion constraint of the copper by the matrix glass, leading to high stress buildup that results in the formation of radial cracks. On the other hand, circumferential cracks are formed during cooling. The free contraction of copper is restricted by the glass matrix, resulting in the buildup of stresses and the formation of circumferential cracks.

Although conformal coatings having cavities within the conductor material may reduce stress buildup and the formation of circumferential cracks, such cavities may become contaminated with corrosive material during post-processing or use, resulting in degradation of the conductor material.

Accordingly, a need exists for alternative methods for metallizing through-glass vias that are hermetically sealed.

SUMMARY

According to a first aspect, an article comprises a glass or glass-ceramic substrate having a first major surface and a second major surface opposite the first major surface, and a via extending through the substrate from the first major surface to the second major surface over an axial length, L, in an axial direction, the via defining an interior surface and a first axial portion, a third axial portion, and a second axial portion disposed between the first axial portion and the third axial portion along the axial direction. The article further comprises a helium hermetic adhesion layer disposed on the interior surface in at least the first axial portion and/or the third axial portion and a metal connector disposed within the via, wherein the metal connector is adhered to the helium hermetic adhesion layer. The metal connector fully fills the via over the axial length, L, of the via, the via has a maximum diameter, $\Phi_{max}$, of less than or equal to 30 μm, and the axial length, L, and the maximum diameter, $\Phi_{max}$, satisfy an equation:

$$\frac{L}{\sqrt{\Phi_{max}}} > 20 \text{ micron}^{1/2}.$$

According to a second aspect, an article comprises the article according to the first aspect, wherein the helium hermetic adhesion layer comprises Ti, TiN, Ta, TaN, Cr, Ni, and a metal oxide.

According to a third aspect, an article comprises the article according to the first or second aspects, wherein the metal connector consists essentially of copper.

According to a fourth aspect, an article comprises the article according to any preceding aspect, wherein the metal connector hermetically seals the via.

According to a fifth aspect, an article comprises the article according to any preceding aspect, wherein the via has a first diameter at the first major surface, a second diameter at the second major surface, and a third diameter in the second axial portion, and wherein the third diameter is less than the first diameter and the second diameter.

According to a sixth aspect, an article comprises the article according to the fifth aspect, wherein the helium hermetic adhesion layer is disposed on the interior surface in the first axial portion, the second axial portion, and the third axial portion.

According to a seventh aspect, an article comprises the article according to the sixth aspect, wherein the maximum diameter, $\Phi_{max}$, is less than or equal to 27 μm.

According to an eighth aspect, an article comprises the article according to the fifth aspect, wherein the helium hermetic adhesion layer is disposed on the interior surface in the first axial portion and/or the third axial portion, and wherein the adhesion layer is not disposed on the interior surface in the second axial portion.

According to a ninth aspect, an article comprises the article according to the eighth aspect, wherein the maximum diameter, $\Phi_{max}$, is less than or equal to 25 μm.

According to a tenth aspect, an article comprises the article according to any of the first through fourth aspects, wherein the via has a first diameter at the first major surface, a second diameter at the second major surface, and a third diameter in the second axial portion, and wherein the first diameter is greater than the second diameter and the third diameter, and wherein the third diameter is greater than the second diameter.

According to an eleventh aspect, an article comprises the article according to the tenth aspect, wherein the helium hermetic adhesion layer is disposed on the interior surface in the first axial portion, the second axial portion, and the third axial portion.

According to a twelfth aspect, an article comprises the article according to the eleventh aspect, wherein the maximum diameter, $\Phi_{max}$, is less than or equal to 19 μm.

According to a thirteenth aspect, an article comprises the article according to the tenth aspect, wherein the helium hermetic adhesion layer is disposed on the interior surface in the first axial portion and/or the third axial portion, and wherein the helium hermetic adhesion layer is not disposed on the interior surface in the second axial portion.

According to a fourteenth aspect, an article comprises the article according to the thirteenth aspect, wherein the maximum diameter, $\Phi_{max}$, is less than or equal to 17 μm.

According to a fifteenth aspect, an article comprises the article according to any of the first through fourth aspects, wherein the via has a first diameter at the first major surface, a second diameter at the second major surface, and a third diameter in the second axial portion, and wherein the first diameter is equal to the second diameter and the third diameter.

According to a sixteenth aspect, an article comprises the article according to the fifteenth aspect, wherein the helium hermetic adhesion layer is disposed on the interior surface in the first axial portion, the second axial portion, and the third axial portion.

According to a seventeenth aspect, an article comprises the article according to the fifteenth aspect, wherein the helium hermetic adhesion layer is disposed on the interior surface in the first axial portion and/or the third axial portion, and wherein the helium hermetic adhesion layer is not disposed on the interior surface in the second axial portion.

According to an eighteenth aspect, an article comprises the article according to the seventeenth aspect, wherein the maximum diameter, $\Phi_{max}$, is less than or equal to 25 μm.

According to a nineteenth aspect, an article comprises the article according to any preceding aspect, wherein the axial length, L, of the via is greater than or equal to 150 μm and less than or equal to 500 μm.

According to a twentieth aspect, an article comprises the article according to any preceding aspect, wherein the axial length, L, and the maximum diameter, $\Phi_{max}$, satisfy an equation:

$$20 \text{ micron}^{1/2} < \frac{L}{\sqrt{\Phi_{max}}} \leq 158 \text{ micron}^{1/2}.$$

According to a twenty-first aspect, an article comprises the article according to any preceding aspect, wherein the article is free of cracks and has a helium permeability of less than $10^{-5}$ atm*cc/s before and after being heated to a temperature of 450° C. and cooled to a temperature of 23° C.

According to a twenty-second aspect, an article comprises the article according to any preceding aspect, wherein the substrate comprises at least 90 wt % silica.

According to a twenty-third aspect, a method of fabricating a glass article comprises depositing a helium hermetic adhesion layer on portions of an interior surface of a via extending through a glass or glass-ceramic substrate, the substrate having a first major surface and a second major surface opposite the first major surface with the via extending through the substrate from the first major surface to the second major surface in an axial direction, the via comprising a first axial portion, a third axial portion, and a second axial portion disposed between the first axial portion and the third axial portion, wherein the helium hermetic adhesion layer is deposited on the interior surface of the via in at least the first axial portion and/or the third axial portion; and depositing a metal connector on the first, second, and third axial portions of the via to fully fill the via. The metal connector fully fills the via over an axial length, L, of the via in the axial direction, the via has a maximum diameter, $\Phi_{max}$, of less than or equal to 30 μm, and the axial length, L, and the maximum diameter, $\Phi_{max}$, satisfy an equation:

$$\frac{L}{\sqrt{\Phi_{max}}} > 20 \text{ micron}^{1/2}.$$

According to a twenty-fourth aspect, a method comprises the method according to the twenty-third aspect, wherein the helium hermetic adhesion layer comprises one or more of Ti, TiN, Ta, TaN, Cr, Ni, and a metal oxide.

According to a twenty-fifth aspect, a method comprises the method according to the twenty-third or twenty-fourth aspect, wherein the metal connector consists essentially of copper.

According to a twenty-sixth aspect, a method comprises the method according to any of the twenty-third through twenty-fifth aspects, wherein the metal connector hermetically seals the via.

According to a twenty-seventh aspect, a method comprises the method according to any of the twenty-third through twenty-sixth aspects, wherein depositing the metal connector comprises depositing the metal connector using electroplating.

According to a twenty-eighth aspect, a method comprises the method according to any of the twenty-third through twenty-seventh aspects, wherein depositing the helium hermetic adhesion layer comprises depositing the helium hermetic adhesion layer on the interior surface of the via in the first axial portion, the second axial portion, and the third axial portion.

According to a twenty-ninth aspect, a method comprises the method according to any of the twenty-third through twenty-seventh aspects, wherein depositing the helium hermetic adhesion layer comprises depositing the helium hermetic adhesion layer on the interior surface of the via in the first axial portion and/or the third axial portion, and wherein the helium hermetic adhesion layer is not deposited on the interior surface in the second axial portion.

According to a thirtieth aspect, a method comprises the method according to any of the twenty-third through twenty-ninth aspects, wherein the substrate comprises at least 90 wt % silica.

DETAILED DESCRIPTION

Figure 1:
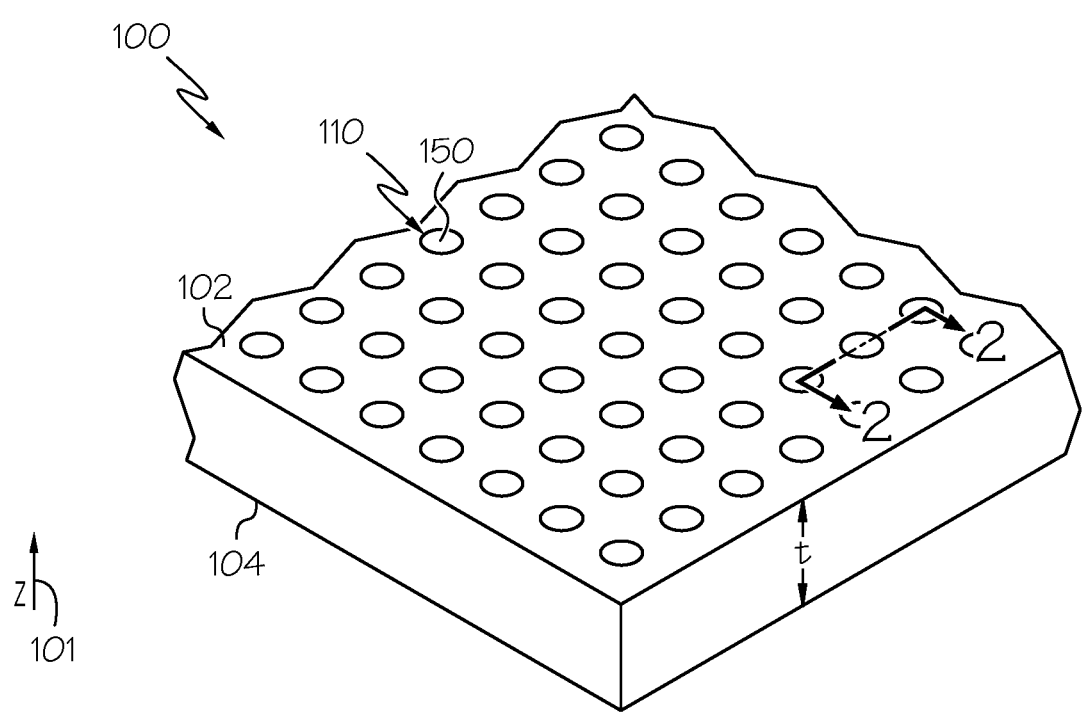
FIG. 1 depicts a perspective view of a substrate with vias.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

Glass and Glass Ceramic Substrates With Vias

Glass and glass ceramic substrates with vias are desirable for a number of applications. For example, 3D interposers with through package via (TPV) interconnects that connect the logic device on one side of the interposer and memory on the other side of the interposer are desirable for high bandwidth devices. Current substrates are either formed from organic materials or silicon. However, organic interposers suffer from poor dimensional stability while silicon wafers are expensive and have high dielectric losses. Glass and glass ceramics may be superior substrate materials due to their relatively low dielectric constants, thermal stability, and relatively low cost. There are applications for glass or glass ceramic substrates with through glass vias (TGV). These vias typically need to be fully or conformally filled with conducting metals, such as copper, to form an electrical pathway. Copper is a particularly desirable conducting metal, but it does not adhere well to glass and there is a large mismatch in the coefficients of thermal expansion of copper and many substrate compositions. The large mismatch in the coefficient of thermal expansions of the copper and the glass can result in the formation of radial and/or circumferential cracking of the glass when the glass article is subjected to high temperature processing. Accordingly, various embodiments described herein have vias that are limited in diameter below a critical threshold to enable the vias to be fully filled with copper without resulting in cracking of the substrate when subjected to high temperature processes.

FIG. 1 shows an article comprising a substrate 100, schematically depicted in a partial perspective view. The substrate 100 comprises a first major surface 102 and a second major surface 104 opposite first major surface 102. A plurality of vias 110 extend through the bulk of the substrate 100 from the first major surface 102 to the second major surface 104. Metal connectors 150 fill vias 110. It should be understood that any number of vias 110 may extend through substrate 100 in any arrangement. Coordinate marker 101 shows the direction of the axial dimension z, which is normal to the plane of the first major surface 102 and the second major surface 104. Unless otherwise specified, the "length" of a via or metal connector is in the axial dimension z. The thickness t of substrate 100, sometimes referred to herein as the axial length L, which is in the axial dimension, may be any appropriate thickness depending on the application.

In various embodiments, the substrate 100 may comprise any suitable glass or glass ceramic substrate. In some particular embodiments, high silica glass or glass ceramic substrates are desirable for certain applications due to their dielectric properties. For example, a glass or glass ceramic material having a silica content of 50 mol %, 55 mol %, 60 mol %, 65 mol %, 70 mol %, 75 mol %, 80 mol %, 85 mol %, 90 mol %, 95 mol %, or 100 mol %, or any range having any two of these values as endpoints, including endpoints, may be used. A glass or glass ceramic material having a silica content of 50 mol % to 100 mol %, or 75 mol % to 100 mol % may be used. In particular embodiments, the substrate comprises at least 90 wt % silica.

For substrates having the dimensions described herein, it is particularly difficult to achieve a hermetically sealed via in high silica glass with copper metal connectors for at least two reasons. First, copper does not adhere well to glass. Second, the CTE mismatch between copper and high silica glass is particularly large, which can result in cracking of the substrate when the substrate is subjected to thermal cycling. The articles and methods described herein achieve a hermetic seal notwithstanding these reasons by providing a superior stress relief mechanism.

FIGS. 2-7 show an article comprising the substrate 100, schematically depicted as a cross section of FIG. 1 along line 2-2'. FIGS. 2-7 show the substrate 100, the coordinate marker 101, the first major surface 102, the second major surface 104, the via 110 and the metal connector 150 of FIG. 1. The interior surface 114 of the via 110 is divided into a first axial portion 116, a second axial portion 118 and a third axial portion 120. A helium hermetic adhesion layer 122 is disposed on the interior surface 114 of the via 110 in the first axial portion 116 and the third axial portion 120. In embodiments, the helium hermetic adhesion layer 122 is disposed on the interior surface 114 of the via 110 along an entire perimeter of at least one of the first axial portion 116 and/or the third axial portion 120. Accordingly, although FIGS. 2-7 depict the helium hermetic adhesion layer 120 as being located in at least the first axial portion 116 and the third axial portion 120, it is contemplated that in other embodiments, the helium hermetic adhesion layer 122 may be located in the first axial portion 116 and not in the third axial portion 120, or in the third axial portion 120 and not in the first axial portion 116. In some embodiments, such as the embodiment depicted in FIGS. 2, 4, and 6, the helium hermetic adhesion layer 122 is not present in the second axial portion 118. Such embodiments are referred to as "partially bonded." However, in other embodiments, such as the embodiments depicted in FIGS. 3, 5, and 7, the helium hermetic adhesion layer 122 is present in the second axial portion 118 and extends along the entire axial length from the first major surface 102 to the second major surface 103. Such embodiments are referred to as "fully bonded." In partially bonded embodiments, the helium hermetic adhesion layer 122 is not present in the second axial portion 118, so the metal connector 150 does not bond as strongly to the interior surface 114 along the second axial portion 118.

The phrase "helium hermetic adhesion layer," as used herein, means an adhesion layer that provides hermeticity to helium at a permeability of less than $10^{-5}$ atm*cc/s as measured using a vacuum-based helium leak testing system by adhering the metal connector 150 to the interior surface 114 of the via 110. In some embodiments, the adhesion layer provides hermeticity to helium at a permeability of less than $10^{-8}$ atm*cc/s. Suitable helium hermetic adhesion layer materials include metals, like titanium (Ti), chrome (Cr), tantalum (Ta), vanadium (V), nickel (Ni), tungsten (W), or metal oxides, like zinc oxide, tungsten oxide, and manganese oxide, or nitrides, like titanium nitride (TiN) and tantalum nitride (TaN). In various embodiments, the helium hermetic adhesion layer comprises one or more of Ti, TiN, Ta, TaN, Cr, Ni, and a metal oxide. The helium hermetic adhesion layer has a thickness of greater than or equal to 1 nm and less than or equal to 500 nm. For example, in some particular embodiments, the helium hermetic adhesion layer has a thickness of about 100 nm.

In some embodiments, such as embodiments that are partially bonded, the axial length of the first axial portion 116 or the third axial portion 120 may be referred to as the "adhesion length," because it is the length into the via 110 along which the metal connector 150 adheres strongly to the substrate 100. In some such embodiments, the adhesion length is greater than or equal to 5 µm and less than or equal to 148 µm. The adhesion length may be greater than or equal to 10 µm and less than or equal to 135 µm, greater than or equal to 10 µm and less than or equal to 130 µm, greater than or equal to 10 µm and less than or equal to 125 µm, greater than or equal to 10 µm and less than or equal to 120 µm, greater than or equal to 10 µm and less than or equal to 115 µm, greater than or equal to 15 µm and less than or equal to 140 µm, greater than or equal to 15 µm and less than or equal to 135 µm, greater than or equal to 15 µm and less than or equal to 130 µm, greater than or equal to 15 µm and less than or equal to 125 µm, greater than or equal to 15 µm and less than or equal to 120 µm, greater than or equal to 20 µm and less than or equal to 140 µm, greater than or equal to 20 µm and less than or equal to 135 µm, greater than or equal to 20 µm and less than or equal to 130 µm, greater than or equal to 20 µm and less than or equal to 125 µm, greater than or equal to 25 µm and less than or equal to 140 µm, greater than or equal to 25 µm and less than or equal to 135 µm, greater than or equal to 25 µm and less than or equal to 130 µm, greater than or equal to 130 µm and less than or equal to 140 µm, greater than or equal to 30 µm and less than or equal to 35 µm, or greater than or equal to 35 µm and less than or equal to 140 µm. In some embodiments, the adhesion length is greater than or equal to 40 µm and less than or equal to 140 µm, greater than or equal to 40 µm and less than or equal to 130 µm, greater than or equal to 40 µm and less than or equal to 120 µm, greater than or equal to 40 µm and less than or equal to 110 µm, greater than or equal to 40 µm and less than or equal to 100 µm, greater than or equal to 40 µm and less than or equal to 90 µm, greater than or equal to 40 µm and less than or equal to 80 µm, greater than or equal to 40 µm and less than or equal to 70 µm, or greater than or equal to 40 µm and less than or equal to 60 µm. For example, the adhesion length may be about 40 µm, 50 µm, 60 µm or 70 µm. It is contemplated that other adhesion lengths may be employed in various embodiments.

The via 110 has a via length 130 in the axial direction, sometimes referred to herein as the axial length, L, of the via 110. In fully bonded embodiments, the adhesion length may be equal to the via length 130. The via 110 has a first diameter 132a at the first major surface 102, a second diameter 132b at the second major surface 104, and a third diameter 132c in the second axial portion 118.

As shown in FIGS. 2-7, the metal connector 150 fully fills the via 110 over the axial length L of the via 110 from the first major surface 102 to the second major surface 104, thereby eliminating the possibility of contamination within cavities in the metal connector 150. The metal connector may be formed from any suitable metal. In some embodiments, copper may be a desirable metal due to its particularly high conductivity. Gold, silver, and other conductive metals may be used, as well as alloys of conductive metals. In embodiments, the metal connector comprises copper. In some particular embodiments, the metal connector consists essentially of copper. Adhered within the via 110, the metal connector 150 hermetically seals the via 110.

Via Shape

In the embodiments described herein, the via 110 can have any one of various shapes. In the embodiments depicted in FIG. 2 and FIG. 3, the via 110 has a tapered interior surface 114 that tapers or narrows from the first diameter 132a at the first major surface 102, and from the second diameter 132b at the second major surface 104, to a waist 125 having a waist diameter equal to the third diameter 132c. Such a configuration is referred to herein as a fully-filled pinched via, or FPV. As used herein, the "waist" of a via refers to the part of a variable-diameter via having the smallest diameter. In these embodiments, the diameter of the via 110 may vary as a function of axial position. The overall "diameter" of the via 110 is the maximum diameter, $\Phi_{max}$. Unless otherwise specified, "via diameter" refers to the maximum diameter. When the via 110 is not circular, the "diameter" of the via 110 is the diameter of a circle having the same cross-sectional area as the via 110, in a plane normal to the axial direction.

The via waist 125 has the smallest diameter along the axial length of the via. The diameter of the via waist as a percentage of the first diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist as a percentage of the second diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist may be 75% of the first diameter or less, and the diameter of the via waist may be 75% of the second diameter or less. The diameter of the via waist may be 20% to 50% of the first diameter or less, and the diameter of the via waist may be 20% to 50% of the second diameter or less. In various embodiments, the third diameter 132c, or the via waist, is greater than or equal to 10 μm and less than or equal to 30 μm. The third diameter 132c may be greater than or equal to 20 μm and less than or equal to 30 μm, or greater than or equal to 22 μm and less than or equal to 27 μm. For example, the third diameter 132c may be 10 μm, 15 μm, 20 μm, 22 μm, 25 μm, 27 μm, or 30 μm. In various embodiments, a ratio of the third diameter 132c to the first diameter 132a is less than or equal to 1:6, less than or equal to 1:5, less than or equal to 1:4, less than or equal to 1:3, or less than or equal to 1:2 and/or a ratio of the third diameter 132c to the second diameter 132b is less than or equal to 1:6, less than or equal to 1:5, less than or equal to 1:4, less than or equal to 1:3, or less than or equal to 1:2.

The via 110 optionally has rounded fillets 124 at interior edges to reduce stress concentration, including at the via waist 125. As used herein, "fillets" refers to a rounded corner along an interior corner of the via 110. Such rounded fillets may be used at any edge in a via shape. The rounded fillets 124 may have any suitable diameter, such as 3 mm, 4 mm, 5 mm, 6 mm, 7 mm, 8 mm, or any or any range having any two of these values as endpoints, including endpoints. Other diameters may be used.

Figure 2:
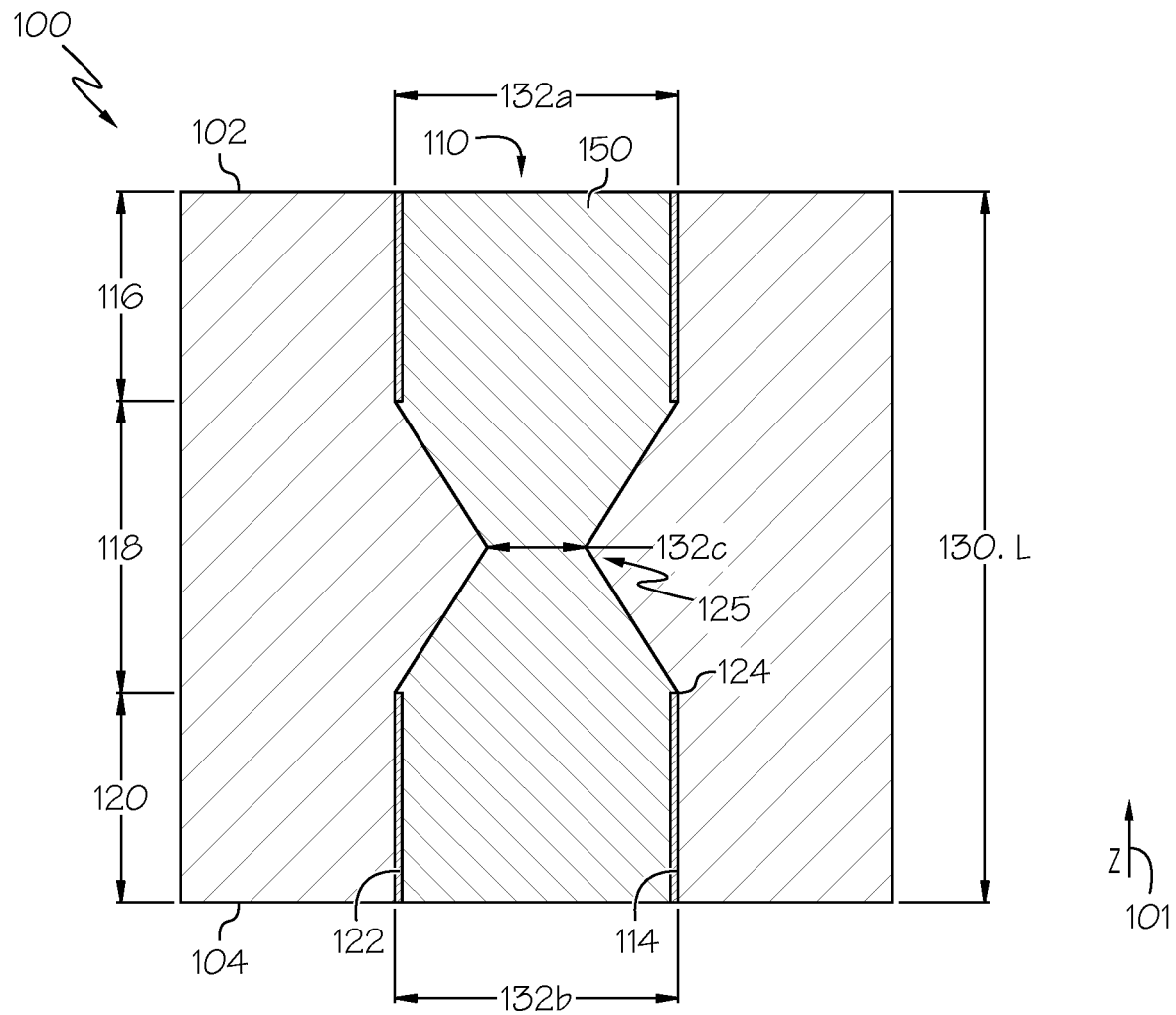
FIG. 2 depicts a cross section of a via having a pinched configuration and being partially bonded, taken along line 2-2' of FIG. 1.
Figure 3:
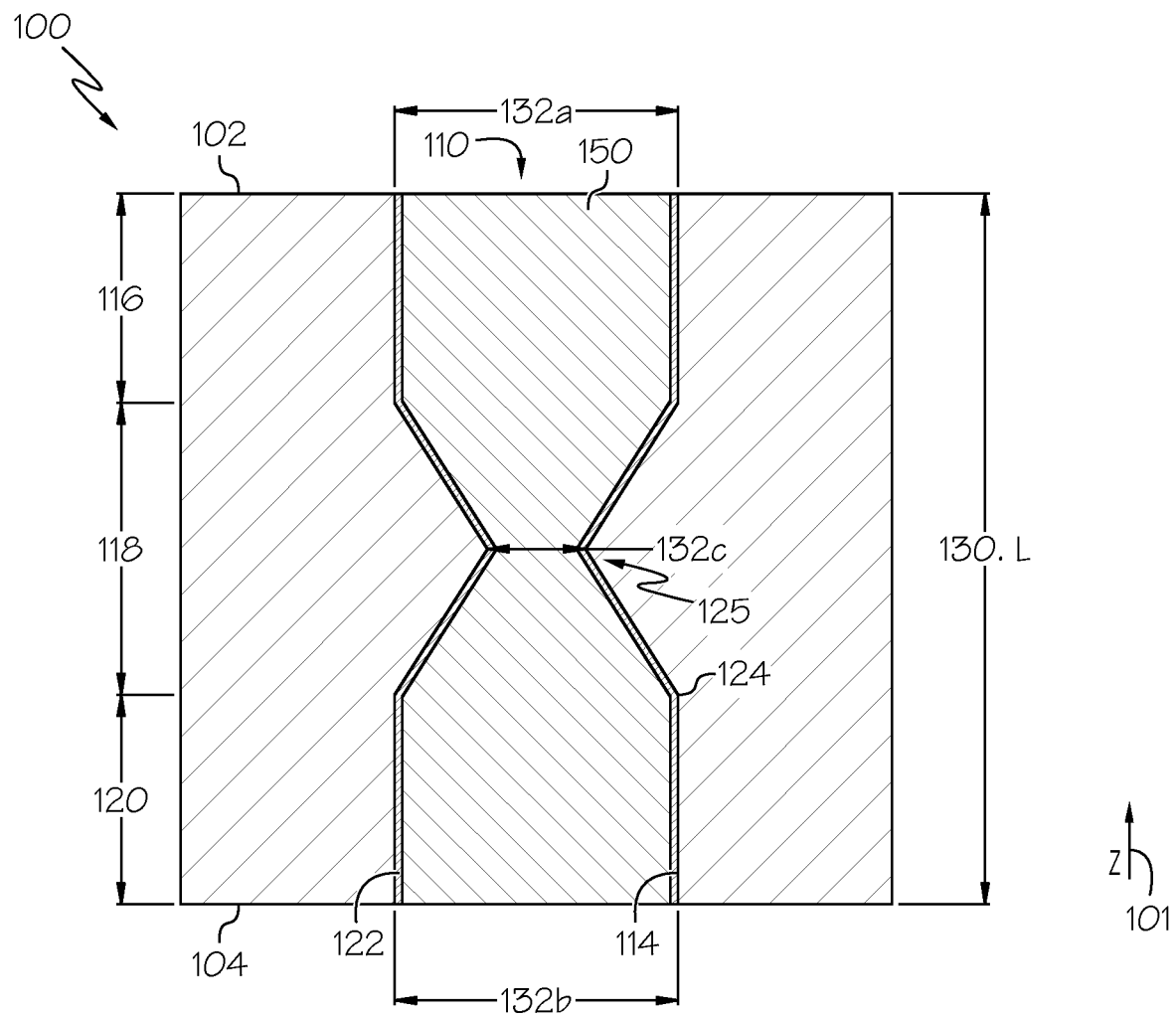
FIG. 3 depicts a cross section of a via having a pinched configuration and being fully bonded, taken along line 2-2' of FIG. 1.

The via 110 has an interior surface 114 with two distinct slopes, with a slope change at fillet 124. The via 110 may have a single slope from each of the first major surface 102 and the second major surface 104 to the waist 125, two slopes as illustrated in FIG. 2, or more complex shapes. One or more of the slopes may be perpendicular to the first major surface 102 and the second major surface 104, as illustrated in FIG. 2.

Figure 4:
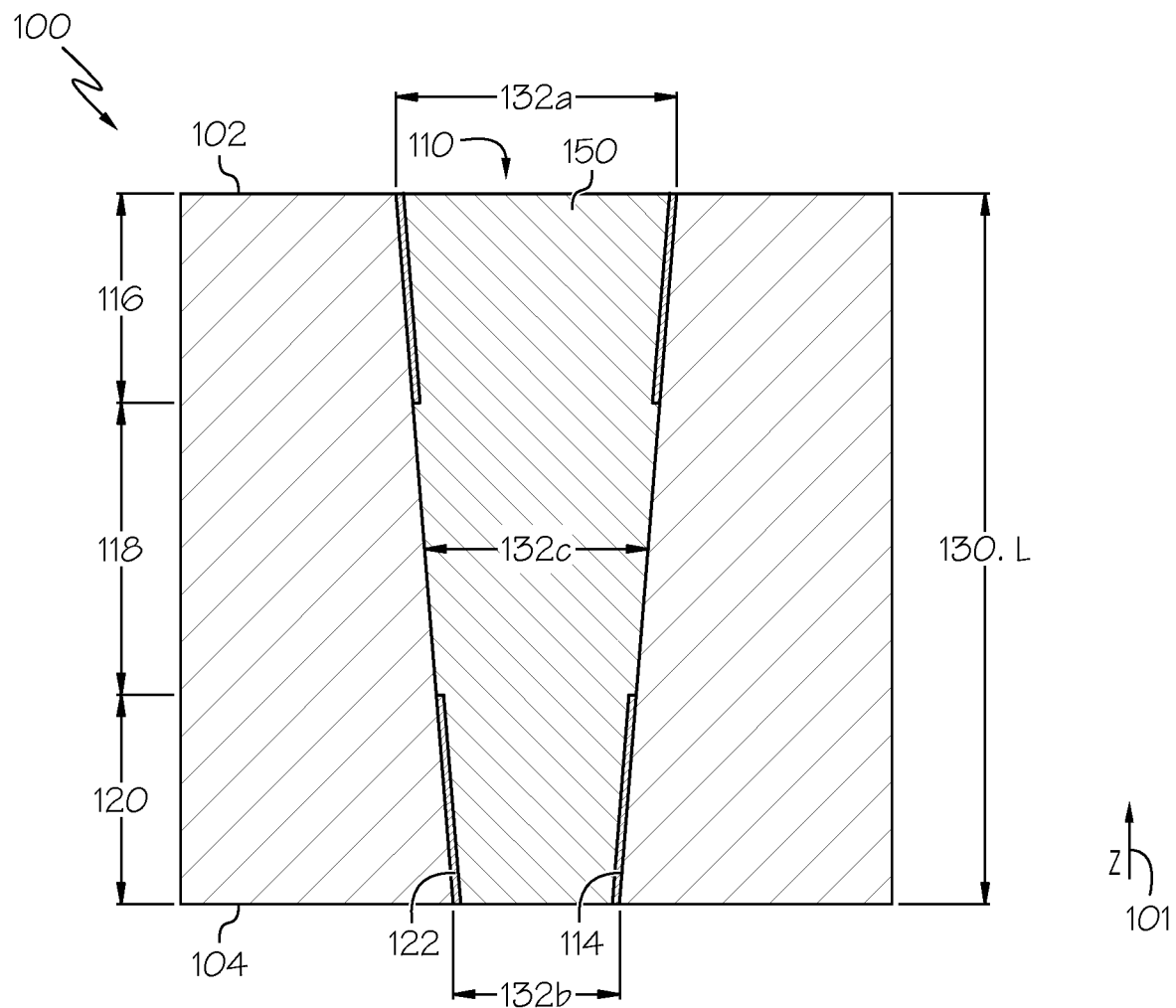
FIG. 4 depicts a cross section of a via having a tapered configuration and being partially bonded, taken along line 2-2' of FIG. 1.
Figure 5:
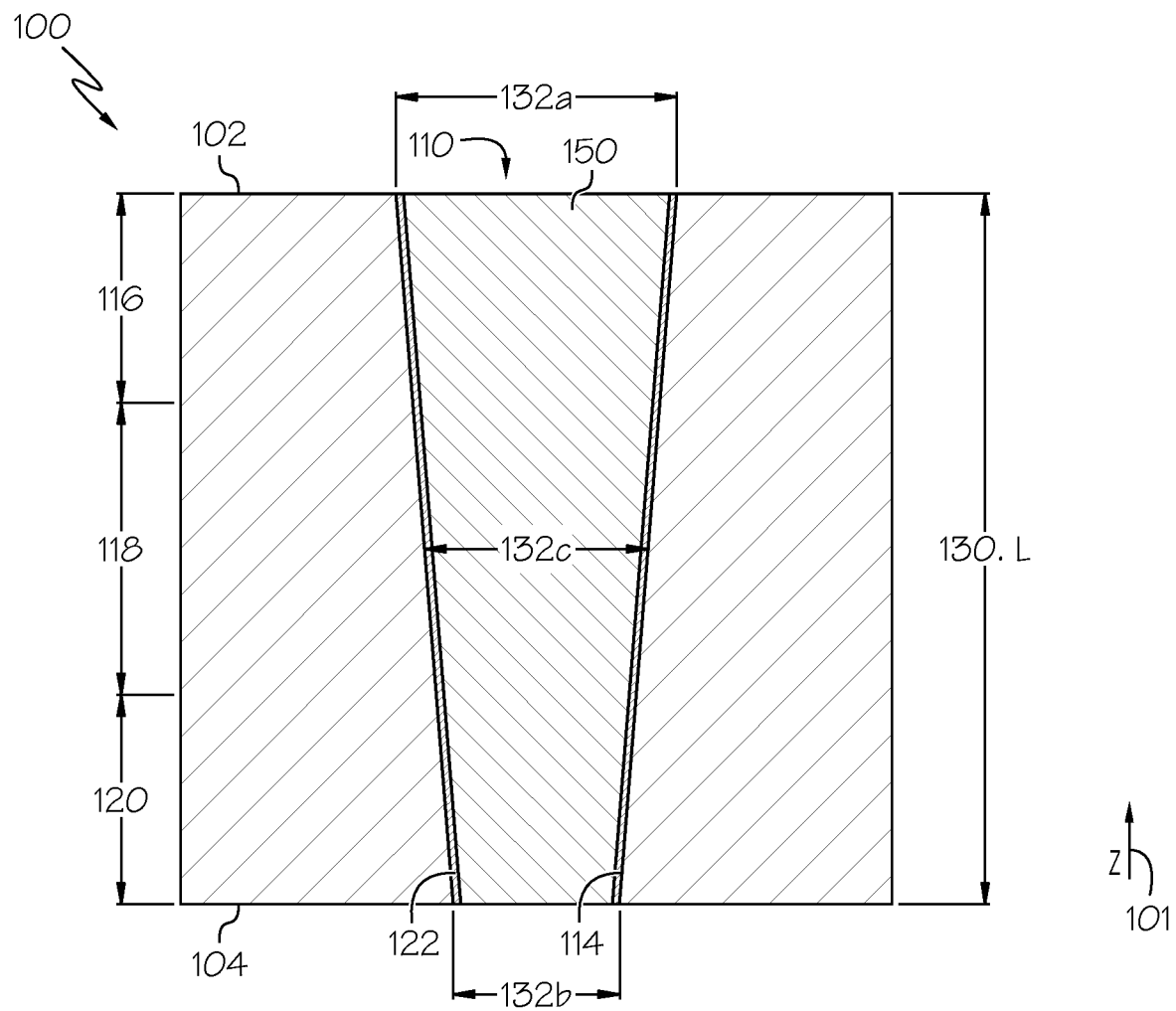
FIG. 5 depicts a cross section of a via having a tapered configuration and being fully bonded, taken along line 2-2' of FIG. 1.

In the embodiments depicted in FIGS. 4 and 5, the via 110 has a tapered interior surface 114 that tapers or narrows from the first diameter 132a at the first major surface 102 to the second diameter 132b at the second major surface 104. The via 110 also includes a third diameter 132c located within the second axial portion that is less than the first diameter 132a and greater than the second diameter 132b. Accordingly, the first diameter 132a is greater than the second diameter 132b and the third diameter 132c, and the third diameter 132c is greater than the second diameter 132b. Such a configuration is referred to herein as a fully-filled tapered via, or FTV. In such embodiments, the first diameter 132a is the maximum via diameter, $\Phi_{max}$.

Figure 6:
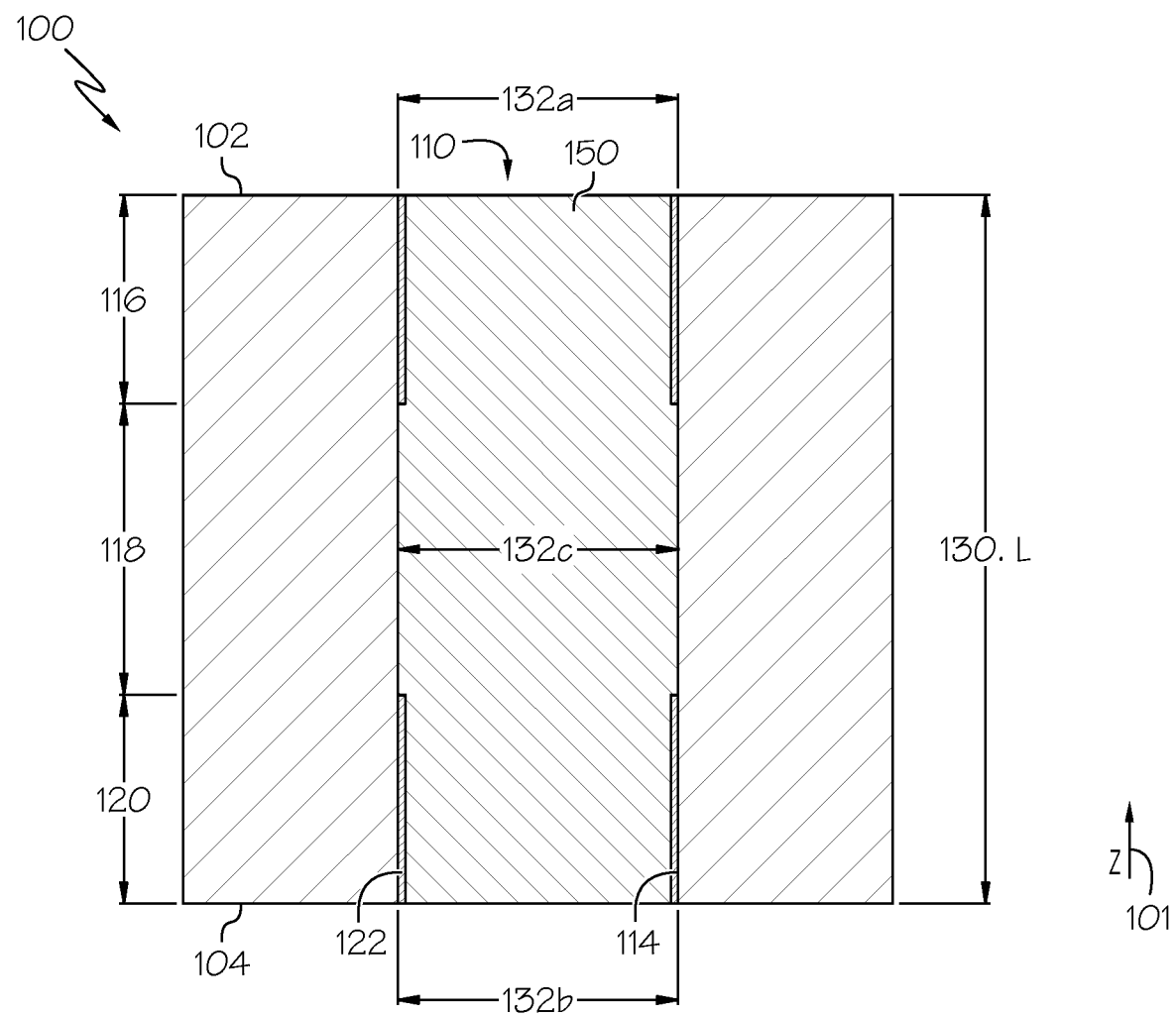
FIG. 6 depicts a cross section of a via having a cylindrical configuration and being partially bonded, taken along line 2-2' of FIG. 1.
Figure 7:
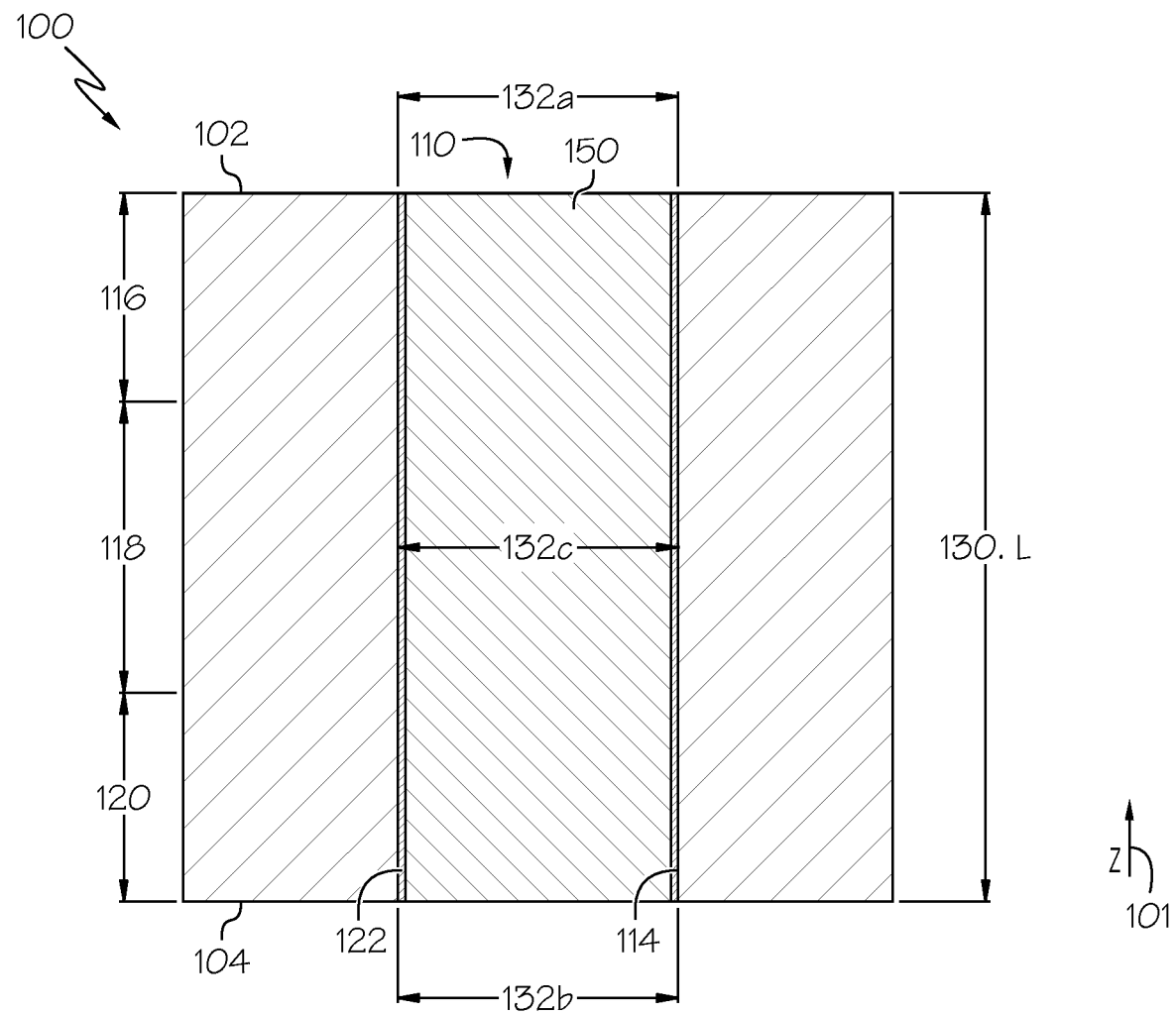
FIG. 7 depicts a cross section of a via having a cylindrical configuration and being fully bonded, taken along line 2-2' of FIG. 1.

In the embodiments depicted in FIGS. 6 and 7, the via 110 has an interior surface 114 that is perpendicular to the first major surface 102 and the second major surface 104. The via has a first diameter 132a at the first major surface 102, a second diameter 132b at the second major surface 104, and a third diameter 132c in the second axial portion that is equal to the first diameter 132a and the second diameter 132b. Such a configuration is referred to herein as a fully-filled cylindrical via, or FCV. In such embodiments, the diameter of the via 110 is constant with axial position.

The via 110 may have any suitable via length 130, or axial length, L. As non-limiting examples, the thicknesses of the substrate 100 (and the via length 130) may be 150 μm, 180 μm, 240 μm, 300 μm, 360 μm, 420 μm, 480 μm, 500 μm, or any range having any two of these values as endpoints, including endpoints. In some embodiments, the thickness t and the via length is 150 μm to 500 μm, or 200 μm to 360 μm.

The via 110 may have any suitable first diameter 132a, second diameter 132b, and third diameter 132c. As non-limiting examples, these diameters may be 5 μm, 10 μm, 13 μm, 15 μm, 17 μm, 19 μm, 20 μm, 21 μm, 22 μm, 24 μm, 25 μm, 27 μm, 30 μm, or any range having any two of these values as endpoints, including endpoints. In some embodiments, the via diameter may be greater than or equal to 1 μm and less than or equal to 30 μm, greater than or equal to 1 μm and less than or equal to 25 μm, greater than or equal to 1 μm and less than or equal to 19 μm, or greater than or equal to 1 μm and less than or equal to 17 μm. As will be described in greater detail below, in various embodiments the maximum diameter, $\Phi_{max}$, of the via 110 is less than or equal to 30 μm, less than or equal to 27 μm, less than or equal to 25 μm, less than or equal to 24 μm, less than or equal to 22 μm, less than or equal to 21 μm, less than or equal to 19 μm, even less than 17 μm, less than or equal to 15 μm, or even less than 13 μm depending on the via shape and whether the metal connector is partially or fully bonded, in order to reduce stress and prevent cracking of the substrate.

In some embodiments, the via 110 is a fully-filled, fully bonded cylindrical via having a maximum diameter, $\Phi_{max}$, of less than or equal to 30 μm, less than or equal to 27 μm, or less than or equal to 24 μm. In other embodiments, the via 110 is a fully-filled, partially bonded cylindrical via having a maximum diameter, $\Phi_{max}$, of less than or equal to 25 μm, less than or equal to 22 μm, or less than or equal to 19 μm. In still other embodiments, the via 110 is a fully-filled, fully bonded tapered via having a maximum diameter, $\Phi_{max}$, of less than or equal to 19 μm, less than or equal to 17 μm, or even less than or equal to 15 μm. In other embodiments, the via 110 is a fully-filled, partially bonded tapered via having a maximum diameter, $\Phi_{max}$, of less than or equal to 17 μm, less than or equal to 15 μm, or less than or equal to 13 μm. In other embodiments, the via 110 is a fully-filled, fully bonded pinched via having a maximum diameter, $\Phi_{max}$, of less than or equal to 27 μm, less than or equal to 24 μm, or less than or equal to 21 μm. In still other embodiments, the via 110 is a fully-filled, partially bonded pinched via having a maximum diameter, $\Phi_{max}$, of less than or equal to 25 µm, less than or equal to 22 µm, or less than or equal to 19 µm.

The axial length of the first, second and third axial portions may be any suitable length. In various embodiments, lengths that achieve a combination of low maximum principal stress and helium hermeticity are selected. In some embodiments, the first and third axial portions have lengths that are independently chosen from 1%, 2%, 3%, 4%, 5%, 6%, 7%, 8%, 9%, 10%, 15%, 20%, 25%, 30%, 35% and 40% of the length of the via, or any range having any two of these values as endpoints, including endpoints. The second axial portion has a length that is 20%, 25%, 30%, 35%, 40%, 45%, 50%, 55%, 60%, 65%, 70%, 75%, 80%, 81%, 82%, 83%, 84%, 85%, 86%, 87%, 88%, 89%, 90%, 91%, 92%, 93%, 94%, 95%, 96%, 97%, or 98%, of the length of the via, or any range having any two of these values as endpoints, including endpoints. The first and third axial portions may have lengths that are 2% to 40% of the length of the via, while the second axial portion has a length that is 20% to 96% of the length of the via.

In various embodiments, the vias are high aspect ratio vias with a via length of 150 µm to 500 µm and a via diameter of 1 µm to 30 µm. As used herein, an "aspect ratio" refers to the ratio of the average thickness of the glass substrate to the average diameter of the vias. A "high aspect ratio" refers to aspect ratios of greater than 3.

In various embodiments described herein, the via 110 has an axial length, L, and a maximum diameter, $\Phi_{max}$, that satisfy the following equation:

$$\frac{L}{\sqrt{\Phi_{max}}} > 20 \text{ micron}^{1/2}.$$

In some embodiments, the via 110 has an axial length, L, and a maximum diameter, $\Phi_{max}$, that satisfy the following equation:

$$20 \text{ micron}^{1/2} < \frac{L}{\sqrt{\Phi_{max}}} \le 158 \text{ micron}^{1/2}.$$

Although conventionally, the aspect ratio ($L/\Phi_{max}$) is used as a critical parameter, it has been found that the ratio $L/(\Phi_{max})^{1/2}$ may be more relevant to the difficulty related to both electroless and electroplating of through-vias. For example, it can be shown that two through-glass via geometries having the same aspect ratio could have different $L/(\Phi_{max})^{1/2}$ values, and the one with the higher $L/(\Phi_{max})^{1/2}$ value is more difficult to metallize. Without being bound by theory, it is believed that the difficulty arises from the fact that the rate of diffusion of copper ions into the via center needs to be fast enough compared to its depletion due to reactions on the side walls either due to autocatalytic reasons (in the case of electroless plating) or charge transfer reactions (in the case of electroplating). Theoretical analysis of the diffusion-reaction equation of the system shows that the diffusion/reaction ratio scales with $L/(\Phi_{max})^{1/2}$. In particular, the higher the value of $L/(\Phi_{max})^{1/2}$, the more challenging is the metallization without forming defects inside the vias due to the depletion of copper.

Fabrication Methods

Through-glass vias with a tapered shape may be fabricated by any suitable method. One method is to form a damage track in the substrate 100 with a laser, followed by etching. Exemplary methods are described in U.S. Pat. No. 9,656,909, and U.S. Patent Application Ser. No. 62/588,615, which are incorporated herein by reference in their entireties. Another method is to modify photosensitive glass with a laser, followed by etching.

Figure 8:
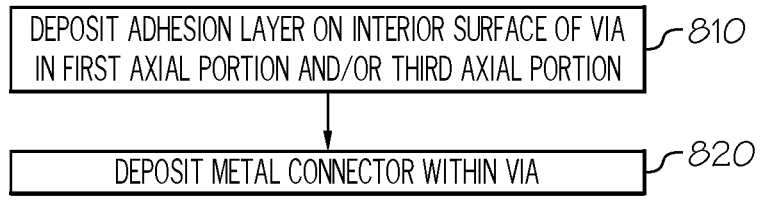
FIG. 8 depicts a flowchart for a process of making a via.

FIG. 8 shows a flowchart illustrating a process for metallizing a through glass via. In a step 810, a helium hermetic adhesion layer is deposited on the interior surface of a via in at least the first axial portion and the third axial portion. In a subsequent step 820, a metal connector is deposited within the via, such that the metal connector adheres to the helium hermetic adhesion layer in at least the first axial portion and the third axial portion.

The helium hermetic adhesion layer may be deposited on the interior surface in the first and the third axial portions, and optionally the second axial portion, by any suitable method. For example, the length of the first and third axial portions in the z dimension may be readily controlled using line of sight deposition methods such as sputtering, and adjusting the deposition angle. The substrate may be rotated during deposition to ensure that the adhesion length is constant around the entire perimeter of the interior surface of the via.

Helium hermetic adhesion layers in the form of films formed from metals, metal oxides, or metal nitrides can be applied to the glass surface using many different methods, like sputtering, ebeam deposition, ion beam deposition, atomic layer deposition, chemical vapor deposition and solution coating.

The metal connector may be deposited by any suitable means. One suitable method for depositing copper (and other metals) is depositing a catalyst such as Pd on the helium hermetic adhesion layer, followed by electroless deposition of copper, followed by electroplating copper. In various embodiments, the electroplating process includes the use of an electroplating bath comprising a metal salt, a supporting electrolyte, and additives, and application of a current at a current density of greater than or equal to 1.5 mA/cm$^2$ and less than or equal to 5 mA/cm$^2$, or greater than or equal to 1.5 mA/cm$^2$ and less than or equal to 2.5 mA/cm$^2$. The metal salt can be a salt of the metal forming the metal connector, such as CuSO$_4$.

Another suitable method may include depositing a metal connector at a "bottom" of the via and continuing to deposit the metal such that the metal material can continue to grow and fill the via until the metal material reaches a "top" of the via. Such a process is sometimes referred to as "bottom-up electrolytic plating."

Other suitable methods for depositing the metal connector include filling the via with metal paste and sintering or chemical vapor deposition (CVD). Suitable methods for depositing copper are further described in US Patent Publication US 2017-0287728 (see, for example, paragraphs [0004]-[0005], which is incorporated by reference in its entirety.

Thermal Cycling

Glass and glass ceramic substrates with filled vias are often subject to thermal cycling. This thermal cycling may occur during device operation, or during fabrication steps subsequent to via filling. In some embodiments, for example, the glass substrate may be subjected to thermal cycling for annealing.

As described above, there is a large mismatch between the coefficient of thermal expansion (CTE) of copper and other metals, and the CTE of many glass and glass ceramic materials. Because of the CTE mismatch, upon heating, the metal connector expands more quickly than the surrounding glass or glass ceramic substrate. Similarly, upon cooling, the metal connector contracts more quickly than the surrounding substrate. This difference in expansion and contraction causes stress which can lead to a number of failure mechanisms, such as delamination or cracking. These failure mechanisms can cause loss of hermeticity and other problems.

Delamination is one failure mechanism. Delamination occurs when a conductive metal, such as copper, detaches from the interior of a via. When there is a weak bond between the conductor and the substrate, the stress caused by thermal cycling can lead to delamination. Delamination can lead to loss of hermeticity, as gas and liquid may penetrate the substrate along the boundary between the delaminated metal connector and the interior surface of the via.

Delamination may be reduced or eliminated by forming a sufficiently strong bond between the substrate and the metal connector. The helium hermetic adhesion layer disposed on the interior surface of the via, between the substrate and the metal connector, may be used to form such a bond. As used herein, and "adhesion layer" refers to any layer or surface treatment that leads to a bond between the metal connector and the substrate sufficiently strong to survive thermal cycling from 23° C. to 450° C.

Although delamination may be prevented by forming a strong bond between the metal connector and substrate, this stronger bond prevents the metal connector from moving relative to the substrate during thermal cycling. As a result, thermal cycling may cause stress in the substrate that leads to cracking and loss of hermeticity.

The 2-D plane-strain solution to the classical Lame problem in elasticity to predict the stress field in glass center is as follows:

$$\sigma_r^A = -\sigma_\theta^A = \frac{-E_f \varepsilon_T}{1 - 2v_f + \frac{1+v_m}{1+v_f}\frac{E_f}{E_m}} \left(\frac{D_f}{2r}\right)^2$$

where $\sigma_r$ and $\sigma_\theta$ are the radial and circumferential stresses, respectively, and $\varepsilon_T = (\alpha_f - \alpha_m)\Delta T$ is the mismatch strain due to a thermal load $\Delta T$. The material properties $\alpha$, E, and v are the CTE, Young's modulus, and Poisson's ratio, with the subscripts f and m for the via (fiber) and glass (matrix), respectively.

Failure can be occurred in both heating and cooling part of thermal cycling. During heating, the greatest expansion mismatch is at the hottest temperatures. Much of the stress in the substrate is compressive at higher temperatures, because the metal connector has expanded more than the substrate. Circumferential tensile stress in the glass, which is dominant during heating, around the metal connector can lead to radial cracking. It can be propagated to the next via. During cooling, the greatest shrinking mismatch is at the lowest temperatures. Much of the stress in the substrate is tensile at lower temperatures, because the metal connector has shrunk more than the substrate. The radial stress, which is dominant during cooling, can lead to cracking. The radial stress is tensile in glass near the surface, which may cause circumferential cracking (C-cracks) of the glass. For both heating and cooling, the presence of the shear stress along the interface can induce interfacial failure by delamination.

Toward the end of a cooling part of thermal cycling, the metal connector 150 has shrunk more than the substrate 100 due to the difference in CTE. Because the metal connector 150 is adhered to the substrate 100, the shrinkage of the metal connector 150 pulls on the substrate 100, placing the substrate 100 in tensile stress. Without sufficient degrees of freedom for stress relief, this tensile stress will cause microcracks in the substrate 100, which can in turn cause loss of hermeticity.

Various embodiments described herein may exhibit helium hermeticity and no cracking after being subjected to thermal cycling. More particularly, in various embodiments, the article is free of cracks and has a helium permeability of less than $10^{-5}$ atm*cc/s, or even less than $10^{-8}$ atm*cc/s, before and after being heated to a temperature of 450° C. and cooled to a temperature of 23° C. In the various embodiments described herein, maintaining a maximum diameter, $\Phi_{max}$, of the via 110 of less than or equal to 30 μm provides helium hermeticity while enabling the substrate and the metal connector to shrink at different rates without generating an amount of tensile stress sufficient to generate microcracks.

Modeling

Figure 9:
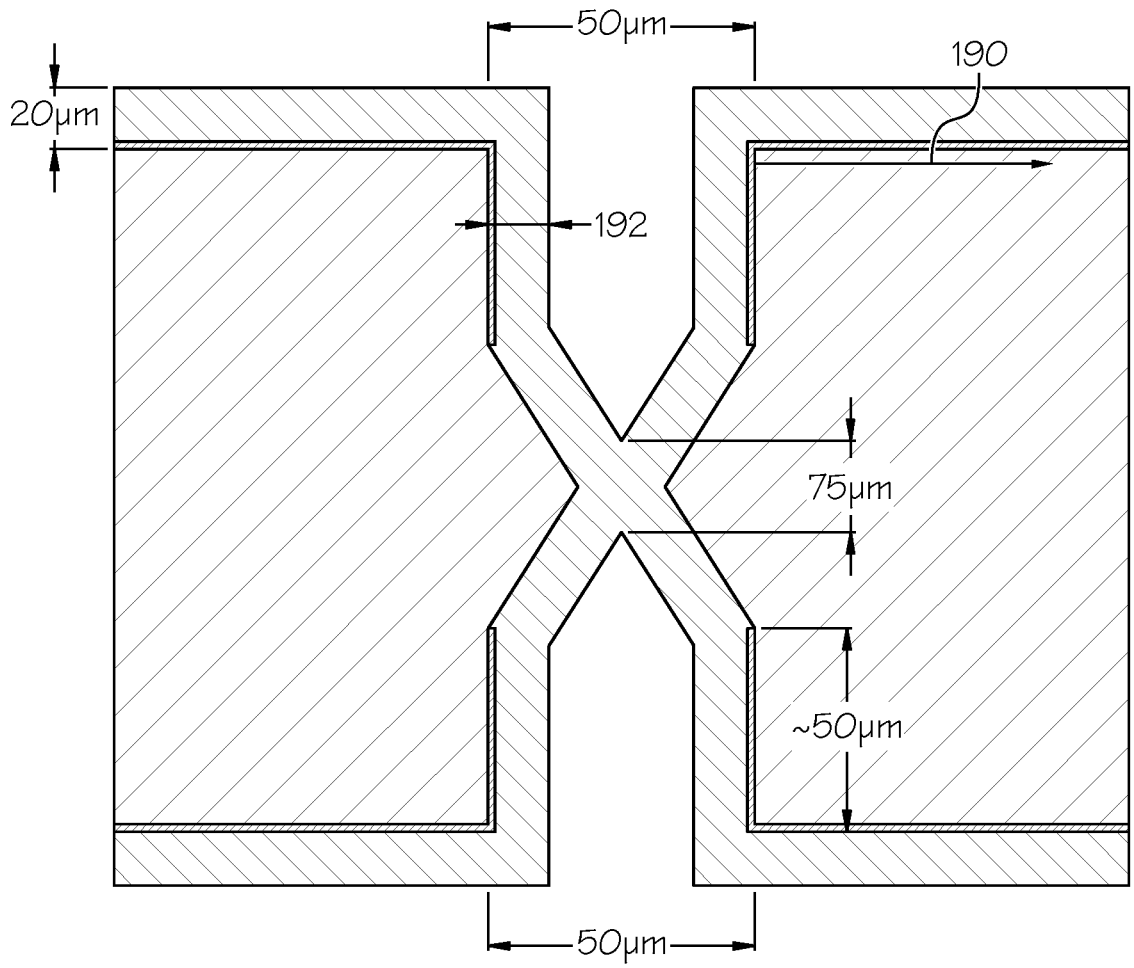
FIG. 9 depicts a configuration of a via having a conformal copper coating used in modeling.

For modeling, the geometry of FIG. 9 was used, where the interior surface of the via is conformally coated with copper everywhere except for 75 μm of axial length, 37.5 μm on each side of the waist, where the via is filled all the way through. The via length was 300 μm. First diameter and second diameter were each 50 μm. The 50 μm diameter is maintained for a distance of 50 μm along the axial length from both surfaces. Starting at 50 μm from the surfaces, the via tapers inwards to a diameter of 20 μm at waist 125, halfway along the axial length. On both of the first and second major surfaces, there is a 20 μm thick copper overburden. It is expected that the modeling results will extend to other via and metal connector shapes having cavities in the metal connector and a second axial portion without strong bonding between the metal connector and substrate.

In one process flow for fabricating an actual device, the geometry of FIG. 9, including the adhered copper overburden, is present when the most severe thermal cycling occurs. Afterwards, the overburden is removed and further processing may occur. But, the geometry of FIG. 9 has relevance to the thermal cycling modeled herein.

The modeling was based on theories drawn from Ryu S K, Lu K H, Zhang X, Im J H, Ho P S, Huang R. *Impact of near-surface thermal stresses on interfacial reliability of through-silicon vias for 3-D interconnects*. IEEE Transactions on Device and Materials Reliability. 2011 March; 11(1):35- ("Ryu"). According to Ryu, there is an analytical solution to predict via and wafer surface stresses when a via is placed in a wafer. But, there is no closed form to predict stresses through thickness. So, modeling is required. For modeling, a single isolated hole in finite plate is modeled. Two-dimensional axi-symmetry is assumed and small enough mesh size of ~0.5 μm is used. ANSYS v. 19 structural modeling software was used to perform the modeling.

Figure 10A:
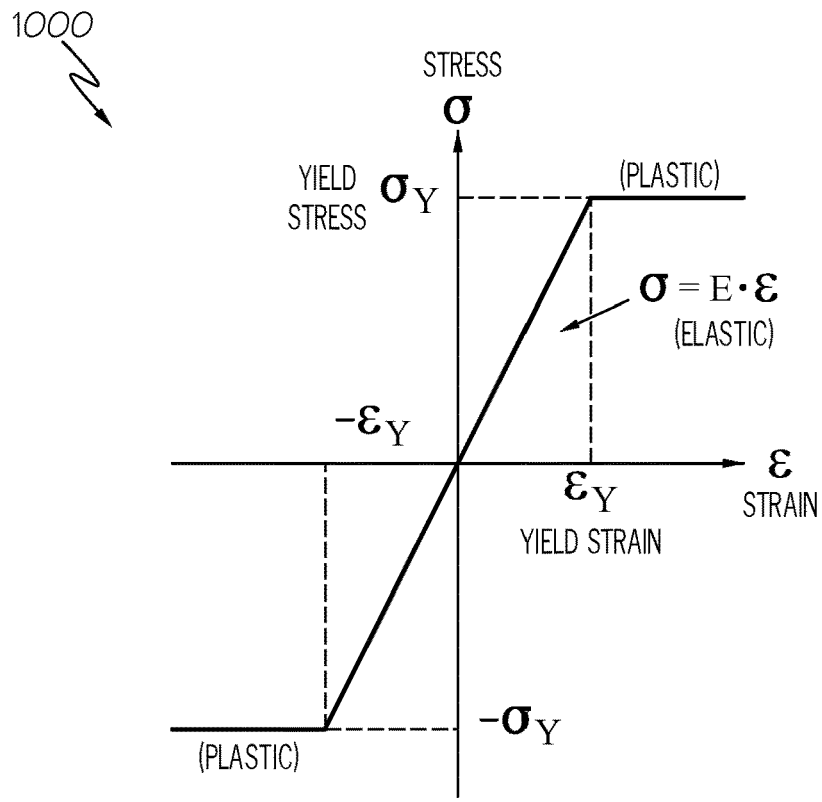
FIG. 10A is a plot of the stress-strain relationship for an elastically perfect plastic material used in the modeling described herein.
Figure 10B:
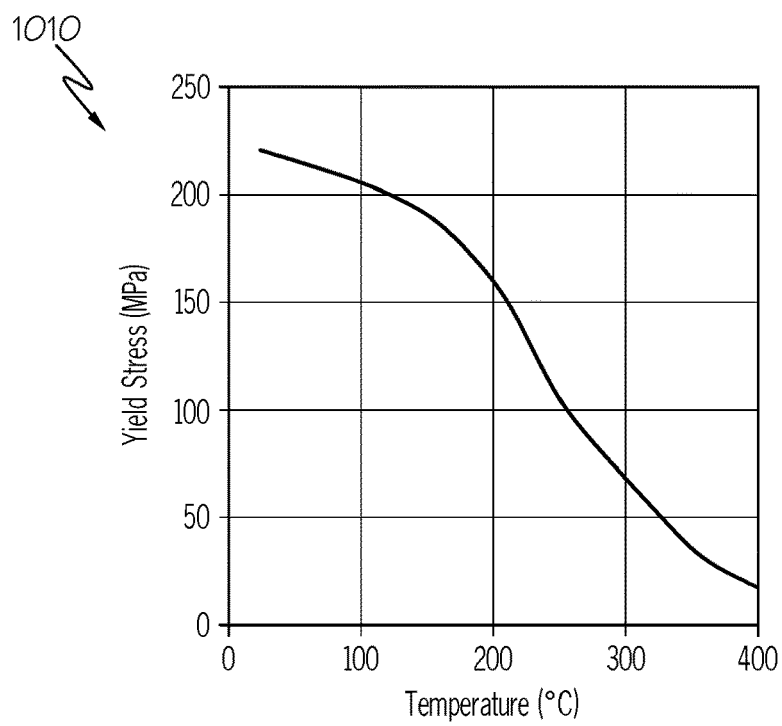
FIG. 10B is a plot of the temperature dependent yield stress of copper used in the modeling described herein.

For the modeling, it was assumed that the glass is elastic, with the properties of fused silica: E (Young's modulus)=73 GPa; v (Poisson's ratio)=0.17 and α (coefficient of thermal expansion)=0.55 ppm/° C. It was assumed that copper has elastically perfect plastic properties, with temperature dependent yield stresses. FIG. 10A shows graph 1000, which illustrates the stress-strain relationship for an elastically perfect plastic material. FIG. 10B shows graph 1010, which illustrates the temperature dependent copper yield stress. The elastic properties of copper used for the modeling were: E (Young's modulus)=121 GPa; v (Poisson's ratio)

=0.35 and α (coefficient of thermal expansion)=17 ppm/° C. It was also assumed that the system including the copper via and fused silica was in a stress-free state at 25° C. The modeling calculated stresses after a thermal cycle from 25° C. to 400° C. and back down to 25° C.

If the glass cracks, it will crack first where the first principal stress is largest, i.e., the "maximum first principal stress." With reference to FIG. 9, modeling showed the highest first principal stress at two points. First, there was a high maximum principal stress on the surface of substrate 100 along line 190, a short distance from the interface between the helium hermetic adhesion layer 122 and the substrate 100. This first point of high stress corresponds to a failure mechanism observed in the samples, microcracks in the surface.

Figure 11:
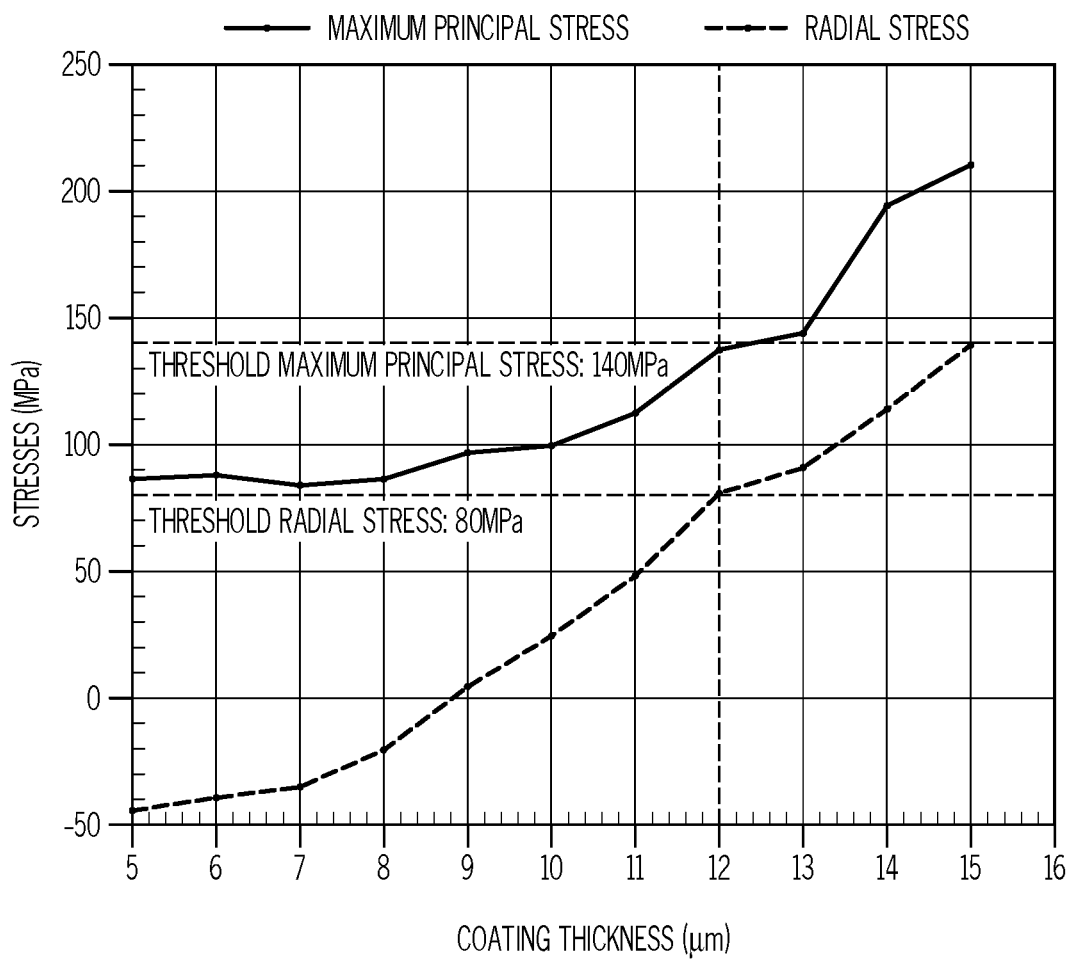
FIG. 11 is a plot of the modeled first maximum principal stress and the modeled maximum radial stress (y-axis) for various copper coating thicknesses (x-axis)

Second, there was a maximum principal stress at point 192. This point is the dominant stress component to induce crack initiation and propagation. FIG. 11 shows a plot of modeled maximum first principal stress and maximum radial stress along line 190 for different copper wall thicknesses. As shown in FIG. 11, the maximum values of both radial stress and maximum first principal stress increase exponentially with temperature. For coating thicknesses of 12 μm or greater, both the maximum first principal stress and maximum radial stress meet or exceed threshold values (140 MPa for maximum first principal stress and 80 MPa for maximum radial stress for the configurations depicted in FIG. 9).

Additional experiments examined the percentage of vias with cracks for different copper coating thicknesses after the wafer was annealed to a maximum temperature of 400° C. The coating thickness was measured at the first or second major surface, and groups were formed based on the integer of the coating thickness measurement. In other words, the group "8 μm" includes coating thicknesses of from 8.00 μm to 8.99 μm, the group "9 μm" includes coating thicknesses of from 9.00 μm to 9.99 μm, and so on. Based on the experimental data, cracking does not occur in vias until the coating thickness is greater than or equal to 12 μm. Based on the modeling and experimental data, the threshold stress for crack formation was determined to correspond to 140 MPa for maximum first principal stress and 80 MPa for radial stress. Accordingly, for values below this stress threshold, cracks are not expected to occur.

Using the critical threshold of 140 MPa for maximum principal stress, modeling was used to determine the required crack-free via diameter in a fully filled configuration, such as the configurations shown in FIGS. 2-7. The same material inputs of the metallized conformal copper configuration shown in FIG. 9 were used in the modeling of the fully-filled via configurations. For tapered configurations, a taper ratio of 5:3 (maximum diameter: minimum diameter) was used.

In order to account for stress computation variability related to the mesh size used in the models, ±10% error was applied. Accordingly, a lower bound of 126 MPa was used to determine the critical via diameter required for the elimination of cracks in fully-filled vias.

Figure 12:
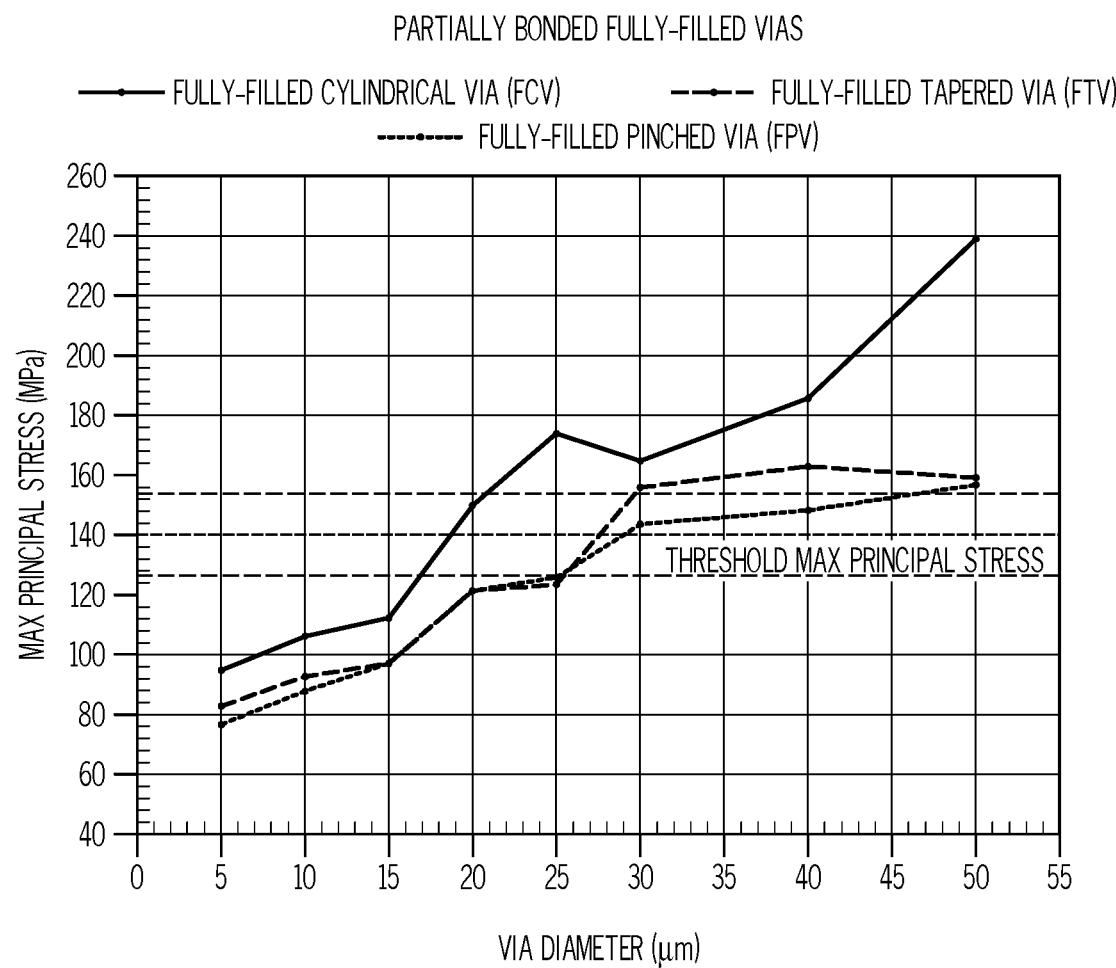
FIG. 12 is a plot of the modeled first maximum principal stress (y-axis) for various via diameters (x-axis) for fully-filled, partially bonded vias.

FIG. 12 is a plot showing the predicted glass surface stress around vias for partially-bonded, fully-filled vias. For the configurations shown in FIGS. 2 and 6 (FPV and FCV, respectively), the lower bound of the critical stress threshold is reached at a diameter of less than or equal to 25 μm. However, the configuration shown in FIG. 4 (FTV) reaches the critical stress threshold at a diameter of less than or equal to 17 μm. Accordingly, the FCV and FPV via shape configurations enable the most via diameter tolerance for providing crack-free, hermetic, fully-filled vias that are partially bonded.

Figure 13:
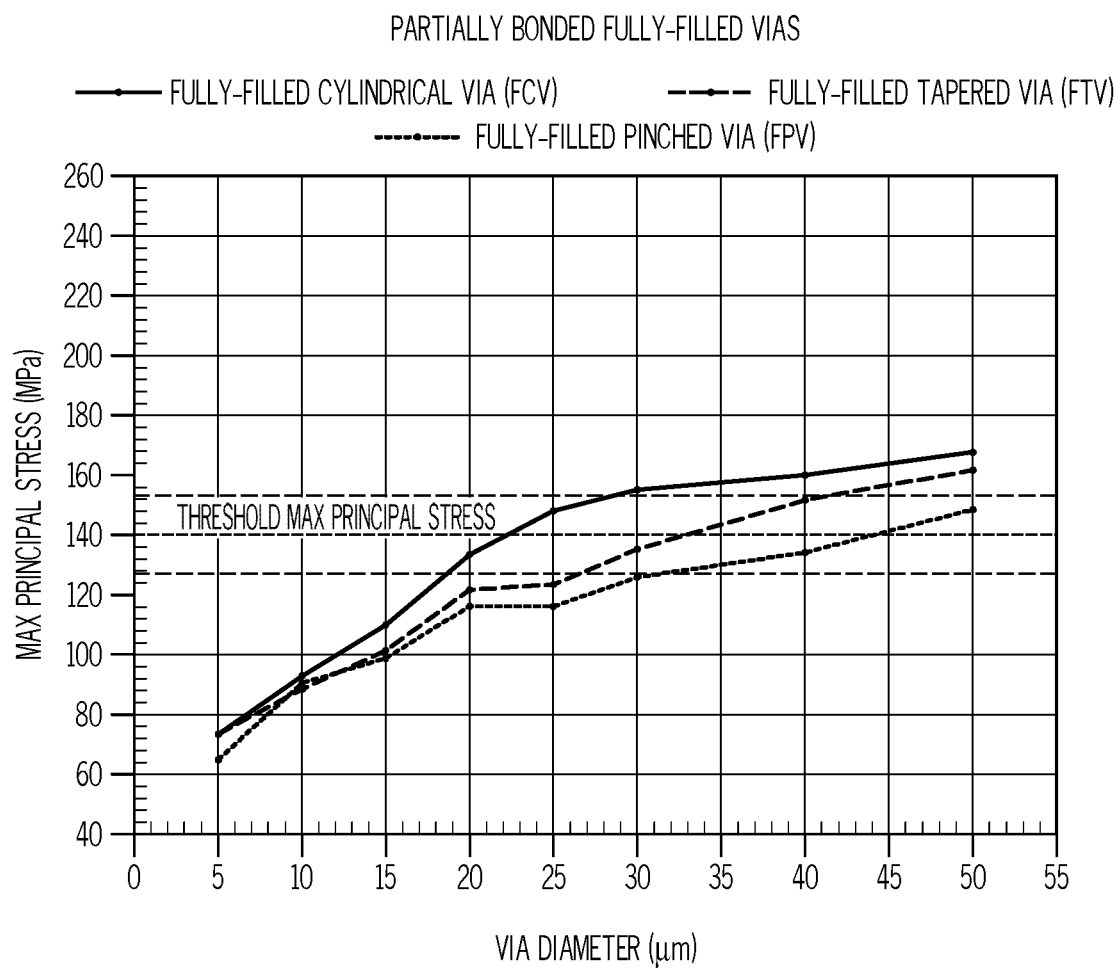
FIG. 13 is a plot of the modeled first maximum principal stress (y-axis) for various via diameters (x-axis) for fully-filled, fully bonded vias.

FIG. 13 is a plot showing the predicted glass surface stress around vias that are fully bonded and fully filled. Based on the modeling, the configuration shown in FIG. 3 (FPV) reaches the critical stress threshold at a diameter of less than or equal to 27 μm, the configuration shown in FIG. 7 (FCV) reaches the critical stress threshold at a diameter of less than or equal to 30 μm, and the configuration shown in FIG. 5 reaches the critical stress threshold at a diameter of less than or equal to 19 μm. The results of the modeling for the different via configurations and bonding parameters are summarized in Table 1.

TABLE 1

Expected Crack-Free Maximum Diameter for Various Via Configurations

| | Fully-filled Via Diameter | |
|---|---|---|
| Via Shape | Fully Bonded | Partially Bonded |
| Fully-Filled Cylindrical Via (FCV) | ≤30 μm | ≤25 μm |
| Fully-Filled Tapered Via (FTP) | ≤19 μm | ≤17 μm |
| Fully-Filled Pinched Via (FPV) | ≤27 μm | ≤25 μm |

As can be seen from the data presented in Table 1, the fully bonded via configurations can support a larger diameter than partially bonded via configurations. Without being bound by theory, it is believed that in the fully bonded configurations, there is greater distribution of the stresses throughout the thickness of the glass, in contrast to partially bonded configurations, where the stresses may be concentrated near the center and surfaces of the substrate. Additionally, experiments conducted showed that the fully bonded configurations exhibited greater protrusion of the metal connector from the surface of the via as compared to the partially bonded configurations.

Conclusion

As used here, the transitional phrase "consisting essentially of" limits the scope of a claim to the specified materials or steps "and those that do not materially affect the basic and novel characteristic(s)" of the claimed invention.

Those skilled in the relevant art will recognize and appreciate that many changes can be made to the various embodiments described herein, while still obtaining the beneficial results. It will also be apparent that some of the desired benefits of the present embodiments can be obtained by selecting some of the features without utilizing other features. Accordingly, those who work in the art will recognize that many modifications and adaptations are possible and can even be desirable in certain circumstances and are a part of the present disclosure. Therefore, it is to be understood that this disclosure is not limited to the specific compositions, articles, devices, and methods disclosed unless otherwise specified. It is also to be understood that the terminology used herein is for the purpose of describing particular embodiments only and is not intended to be limiting. Features shown in the drawing are illustrative of selected embodiments of the present description and are not necessarily depicted in proper scale. These drawing features are exemplary, and are not intended to be limiting.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or description that the steps are to be limited to a specific order, it is no way intended that any particular order be inferred.

What is claimed is:

1. An article comprising:
a glass or glass-ceramic substrate having a first major surface and a second major surface opposite the first major surface, and a via extending through the substrate from the first major surface to the second major surface over an axial length, L, in an axial direction, the via defining:
an interior surface; and
a first axial portion, a third axial portion, and a second axial portion disposed between the first axial portion and the third axial portion along the axial direction;
a helium hermetic adhesion layer disposed on the interior surface in at least the first axial portion and/or the third axial portion, the helium hermetic adhesion layer not disposed on the interior surface in the second axial portion; and
a metal connector disposed within the via, wherein the metal connector is adhered to the helium hermetic adhesion layer,
wherein:
the metal connector fully fills the via over the axial length, L, of the via;
the via has a maximum diameter, $\Phi_{max}$, of less than or equal to 30 µm; and
the axial length, L, and the maximum diameter, $\Phi_{max}$, satisfy an equation:

$$\frac{L}{\sqrt{\Phi_{max}}} > 20 \text{ micron}^{1/2}.$$

2. The article according to claim 1, wherein the helium hermetic adhesion layer comprises one or more of Ti, TiN, Ta, TaN, Cr, Ni, and a metal oxide.

3. The article according to claim 1, wherein the metal connector consists essentially of copper.

4. The article according to claim 1, wherein the metal connector hermetically seals the via.

5. The article according to claim 1, wherein the via has a first diameter at the first major surface, a second diameter at the second major surface, and a third diameter in the second axial portion, and wherein the third diameter is less than the first diameter and the second diameter.

6. The article according to claim 5, wherein the helium hermetic adhesion layer is disposed on the interior surface in the first axial portion and the third axial portion.

7. The article according to claim 6, wherein the maximum diameter, $\Phi_{max}$, is less than or equal to 27 µm.

8. The article according to claim 1, wherein the helium hermetic adhesion layer is disposed on the interior surface in the first axial portion and the third axial portion.

9. The article according to claim 1, wherein the maximum diameter, $\Phi_{max}$, is less than or equal to 25 µm.

10. The article according to claim 1, wherein the via has a first diameter at the first major surface, a second diameter at the second major surface, and a third diameter in the second axial portion, and wherein the first diameter is greater than the second diameter and the third diameter, and wherein the third diameter is greater than the second diameter.

11. The article according to claim 10, wherein the maximum diameter, $\Phi_{max}$, is less than or equal to 19 µm.

12. The article according to claim 10, wherein the helium hermetic adhesion layer is disposed on the interior surface in the first axial portion and the third axial portion.

13. The article according to claim 12, wherein the maximum diameter, $\Phi_{max}$, is less than or equal to 17 µm.

14. The article according to claim 1, wherein the via has a first diameter at the first major surface, a second diameter at the second major surface, and a third diameter in the second axial portion, and wherein the first diameter is equal to the second diameter and the third diameter.

15. The article according to claim 1, wherein the substrate comprises at least 90 wt % silica.

16. A method of fabricating a glass article, the method comprising:
depositing a helium hermetic adhesion layer on portions of an interior surface of a via extending through a glass or glass-ceramic substrate, the substrate having a first major surface and a second major surface opposite the first major surface with the via extending through the substrate from the first major surface to the second major surface in an axial direction, the via comprising a first axial portion, a third axial portion, and a second axial portion disposed between the first axial portion and the third axial portion, wherein the helium hermetic adhesion layer is deposited on the interior surface of the via in at least the first axial portion and/or the third axial portion, and wherein the helium hermetic adhesion layer is not disposed on the interior surface in the second axial portion;
depositing a metal connector on the first, second, and third axial portions of the via to fully fill the via, wherein:
the metal connector fully fills the via over an axial length, L, of the via in the axial direction;
the via has a maximum diameter, $\Phi_{max}$, of less than 30 µm; and
the axial length, L, and the maximum diameter, $\Phi_{max}$, satisfy an equation:

$$\frac{L}{\sqrt{\Phi_{max}}} > 20 \text{ micron}^{1/2}.$$

17. The method according to claim 16, wherein the helium hermetic adhesion layer comprises one or more of Ti, TiN, Ta, TaN, Cr, Ni, and a metal oxide.

18. The method according to claim 16, wherein the metal connector consists essentially of copper.

19. The method according to claim 16, wherein the metal connector hermetically seals the via.

20. The article according to claim 1, wherein the substrate comprises at least 70 mol % silica.

* * * * *

UNITED STATES PATENT AND TRADEMARK OFFICE
CERTIFICATE OF CORRECTION

PATENT NO. : 11,171,094 B2  
APPLICATION NO. : 16/744776  
DATED : November 9, 2021  
INVENTOR(S) : Mazumder et al.

Page 1 of 1

It is certified that error appears in the above-identified patent and that said Letters Patent is hereby corrected as shown below:

On the Title Page

On page 2, in Column 1, item (56), Other Publications, Line 6, delete "(2000." and insert -- (2000). --, therefor.

Signed and Sealed this  
Twenty-ninth Day of March, 2022

Drew Hirshfeld  
*Performing the Functions and Duties of the*  
*Under Secretary of Commerce for Intellectual Property and*  
*Director of the United States Patent and Trademark Office*